US008929429B2

(12) United States Patent
Takatori et al.

(10) Patent No.: US 8,929,429 B2
(45) Date of Patent: Jan. 6, 2015

(54) ADAPTIVE PADE FILTER AND TRANSCEIVER

(76) Inventors: Hiroshi Takatori, Sacramento, CA (US); Albert Vareljian, Folsom, CA (US); Oleksiy Zabroda, Ottawa (CA)

( * ) Notice: Subject to any disclaimer, the term of this patent is extended or adjusted under 35 U.S.C. 154(b) by 717 days.

(21) Appl. No.: 12/905,912

(22) Filed: Oct. 15, 2010

(65) Prior Publication Data

US 2011/0150071 A1     Jun. 23, 2011

Related U.S. Application Data

(60) Provisional application No. 61/252,050, filed on Oct. 15, 2009.

(51) Int. Cl.
| | |
|---|---|
| *H03H 7/30* | (2006.01) |
| *H03H 7/40* | (2006.01) |
| *H03K 5/159* | (2006.01) |
| *H04L 25/03* | (2006.01) |
| *H03H 11/26* | (2006.01) |
| *H03H 11/46* | (2006.01) |
| *H03H 15/02* | (2006.01) |

(52) U.S. Cl.
CPC ......... *H04L 25/03038* (2013.01); *H03H 11/26* (2013.01); *H03H 11/46* (2013.01); *H03H 15/02* (2013.01); *H04L 25/03133* (2013.01); *H04L 25/03343* (2013.01); *H04L 2025/03477* (2013.01); *H04L 2025/0349* (2013.01); *H04L 2025/03598* (2013.01)
USPC .......................................................... 375/233

(58) Field of Classification Search
USPC .......................................................... 375/233
See application file for complete search history.

(56) References Cited

U.S. PATENT DOCUMENTS

| | | | | |
|---|---|---|---|---|
| 6,421,378 | B1 * | 7/2002 | Fukuoka et al. | 375/229 |
| 7,206,342 | B1 * | 4/2007 | Castagnozzi et al. | 375/233 |
| 2007/0258517 | A1 * | 11/2007 | Rollings et al. | 375/233 |
| 2009/0028234 | A1 * | 1/2009 | Zhu | 375/233 |

OTHER PUBLICATIONS

"IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment 4: Ethernet Operation over Electrical Backplanes", IEEE Std 802.3ap-2007, Mar. 22, 2007, 203 pages.

(Continued)

*Primary Examiner* — Tanmay Shah
(74) *Attorney, Agent, or Firm* — Robert D. McCutcheon

(57) ABSTRACT

According to an embodiment of the disclosure, a communication transmitter and receiver include an adaptive filter and a decision feedback equalizer as well as cross-talk cancellers. The adaptive filter is configured to receive an input signal and includes a continuous analog delay circuit with a plurality of Padé-based delay elements.

12 Claims, 16 Drawing Sheets

(56) References Cited

OTHER PUBLICATIONS

"IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment 2. Physical Layer and Management Parameters for 10 Gb/s Operation, Type 10GBASE-LRM", IEEE Std 802.3aq-2006, Oct. 16, 2006. 62 pages.
"Henri Eugene Pade", http://www-groups.dcs.st-and.ac.ak/~history/Biographies/Pade.html, Nov. 2002, 4 pages.
Eric W. Weisstein, "Pade Approximant", http://mathworld.wolfram.com/PadeApproximant.html, retreived online Mar. 10, 2011, 3 pages.
Jui-Kuo Juan, "Analog Implementations of Locally Recurrent Adaptive Filters", PhD Dissertation, University of Florida, May 1998, 120 pages.
Baker, G.A. Jr., "Essentials of Pade Approximants in Theoretical Physics", New York: Academic Press, 1975, p. 27-38.
Edward A. Lee, et al., "Digital Communication", Kluwer Academic Publishers, Chapter 9.3, Adaptive DFE References, 4 pages.
"High-Definition Multimedia Interface, Specification Version 1.3a", Nov. 10, 2006, 269 pages.

\* cited by examiner

US 8,929,429 B2

ADAPTIVE PADÉ FILTER AND TRANSCEIVER

CROSS-REFERENCE TO RELATED APPLICATIONS

This application claims priority to U.S. Provisional Patent Application Ser. No. 61/252,050 entitled Adaptive Padé Filter filed on Oct. 15, 2009, the entirety of which is hereby incorporated by reference.

TECHNICAL FIELD

The present disclosure relates generally to the filters utilized in communications, and more particularly, to an adaptive Padé filter.

BACKGROUND

A variety of different types of filters have been utilized in communication settings. With ever-increasing data transmission speeds in such communication settings, problems have begun to develop. Conventional filters simply do not account for issues that arise with higher transmission speeds.

Accordingly, there is a need for an adaptive filter that address issues with higher data transmission speeds.

SUMMARY

According to an embodiment of the disclosure, a communication receiver comprises an adaptive filter and a decision feedback equalizer. The adaptive filter is configured to receive an input signal and comprises a continuous analog delay circuit with a plurality of Padé-based delay elements. The decision feedback equalizer is coupled to an output of the adaptive filter and is configured to recover data carried by the input signal.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document. Those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

The FIGURES, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Particular embodiments of the disclosure apply a mathematical approximation theory established by mathematician Henri Padé to an adaptive filter implementation manufactured with a conventional integrated circuit. Henry Padé's theory is generally described in the book entitled Essentials of Padé Approximants (New York: Academic Press, 1975) at pp. 27-38.

Particular embodiments of the disclosure create an arbitrary s-domain transfer-function with Padé's approximation theory.

Non-limiting applications of adaptive filters created using Padé's theory include channel equalization, cross-talk cancellation, and reflection cancellation for high speed digital transmission systems. Although such example applications are provided in this disclosure, it should be understood that other applications may avail from teachings of the disclosure.

Figure 1:
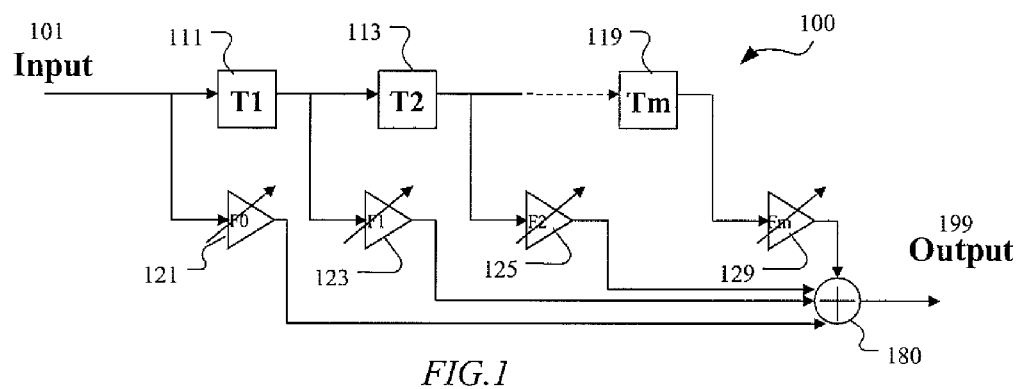
FIG. 1 shows a block diagram of a general filter structure.

FIG. 1 shows a block diagram of a general filter structure 100. The filter structure 100 receives an input signal 101 and delivers an output signal 199. The filter structure 100 is shown with delay elements 111, 113, 119; variable amplification elements 121, 123, 125, 129; and a summation element 180. The dashed lines indicate that additional elements may be included.

The transfer function, T, for the filter structure 100 can be defined as:

$$T = F0 + \sum_{j=1}^{m} Fj \prod_{i=1}^{j} Ti \quad (1)$$

As an example, when m=3

$$T=F0+F1T1+F2T1T2+F3T1T2T3 \quad (2)$$

When the filter is implemented with the sampled signal processing with the sampling time, Ti=1/Z (one unit delay), then:

$$T(z) = F0 + \frac{F1}{Z} + \frac{F2}{Z^2} + \frac{F3}{Z^3} \quad (3)$$

By analogy, delay approximation by Padé of order n; when n=1 is applied, the following is yielded:

$$Ti = \frac{-s+a}{s+a} \quad (4)$$

where a=constant.
For m=3, substituting (4) into (1) gives:

$$T(s) = \frac{N(s)}{D(s)} = \frac{b3s^3 + b2s^2 + b1s + b0}{s^3 + 3as^2 + 3a^2s + a^3} \quad (5)$$

where, $$b3=F0-F1+F2-F3$$

$$b2=a(3F0-F1-F2+3F3)$$

$$b1=a^2(3F0+F1-F2-3F3)$$

$$b0=a^3(F0+F1+F2+F3) \quad (6)$$

From (6) it can be seen that the transfer function numerator N(s) coefficients can be varied by setting F0~F3 values, hence yielding desirable filter characteristic.

The process of setting coefficients F0~F3 is called "adaptation." There are various kinds of adaptation algorithms. Several non-limiting example adaptation algorithms will be described below.

Figure 2:
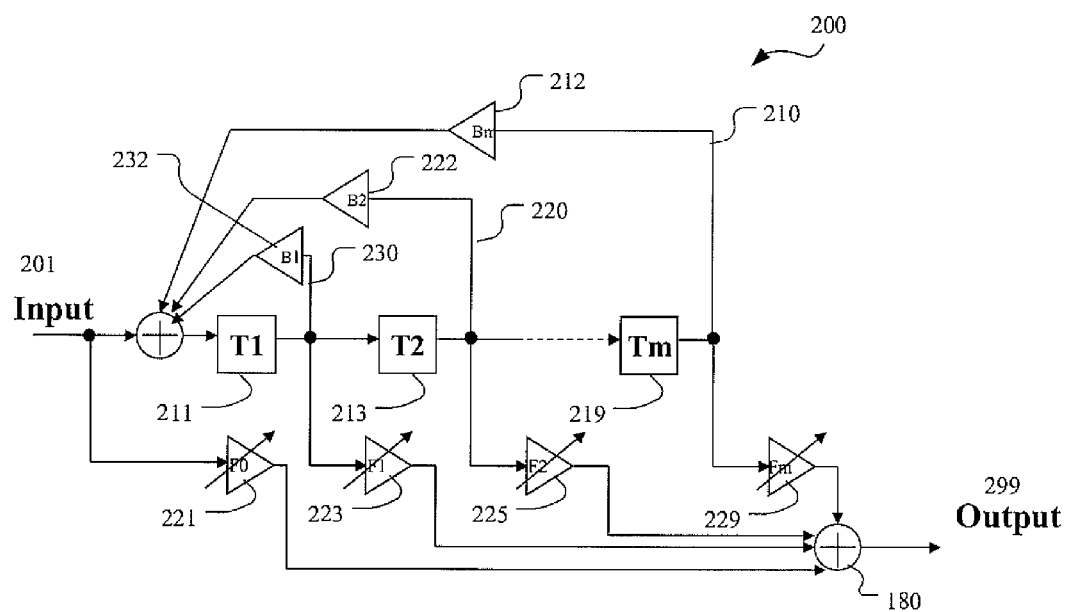
FIG. 2 shows a block diagram of a general filter structure.

FIG. 2 shows a block diagram of a general filter structure 200. The filter structure 200 of FIG. 2 is similar to the filter structure 100 of FIG. 1, including delay elements 211, 213, 219; variable amplification elements 221, 223, 225, 229; and a summation element 280 with the dashed lines indicating other elements may be added. Unlike FIG. 1, the filter structure 200 of FIG. 2 includes feedback paths 210, 220, 230 (with corresponding amplification elements 212, 222, 232) between the input 201 and the output 299. By adding feedback paths 210, 220, and 230 to the filter structure 200, more complex denominators can be achieved.

The transfer function of such a recursive filter becomes:

$$T = \frac{F0 + \sum_{j=1}^{m} Fj \prod_{i=1}^{j} Ti}{1 + \sum_{j=1}^{m} 3Bj \prod_{i=1}^{m} Ti} \quad (7)$$

Although not shown, one of ordinary skill in the art will also recognize that the filter structures 100, 200 of FIGS. 1 and 2 have transposed forms as well.

Although particular embodiments of this disclosure focus on applications for copper/conductor cable or PCB traces, other applications may avail from teachings of this disclosure. Such other applications, include, but are not limited to, optical and wireless transmission systems. Particular embodiments may accomplish highly accurate signal processing with very low power consumption compared to conventional systems.

The following is a non-exhaustive listing of applications that may avail from certain teachings of this disclosure:
  next generation products such as 10G-Ethernet, High Speed Multimedia Interface (HDMI) version 1-3, USB 3.0, and several kinds of interconnects such as chip to chip, backplane, and copper/conductor between racks in the Internet data center.
  optical systems such as 10GBASE-LRM.

Some of the above-referenced applications are now being discussed in several standards such as http://www.HDMI.org, Intel Developer Forum (IDF), Optical Internetworking Forum (OIF), IEEE802.3aq, and IEEE802.3ap/High Speed Study Group (HSSG).

The data rates for current systems on a single transmission line are in the range of 2-3 Gbps. As the demand increases for faster Internet speed, next generation systems will need to transmit data at much faster speeds. Increased speeds are desirable/needed, such as for example, 5-10 Gbps for HDMI, 5 Gbps for USB, 25 Gbps for chip-to-chip systems, and 10-25 Gbps for backplane and copper/fiber interconnects. Additionally, other systems and applications may need even higher data transmission rates.

It is extremely difficult to increase data rate higher than 5 Gbps on the copper/conductor or PCB traces because of issues that have previously been ignored in the past for lower data rate designs. Because such issues were previously ignored, the attempt to increase the data rates on such conventional systems has resulted in degraded system with increased bit error ratio. Among the impairments encountered are the following:

Crosstalk from the adjacent signals at the connector, IC package or PCB vias, etc, Reflections at connectors and IC termination, and Skin effect and Dielectric loss of PCB trace and cable, skew and temperature and humidity variations.

Because an inordinate amount of signal processing was previously required to eliminate or reduce these issues for systems having data transmission rates higher than 5 Gbps, prior art devices were not developed to solve such problems. Accordingly, certain embodiments of the disclosure solve one or more of these problems with a relatively simple integrated circuit (IC) implementation.

Figure 3A:
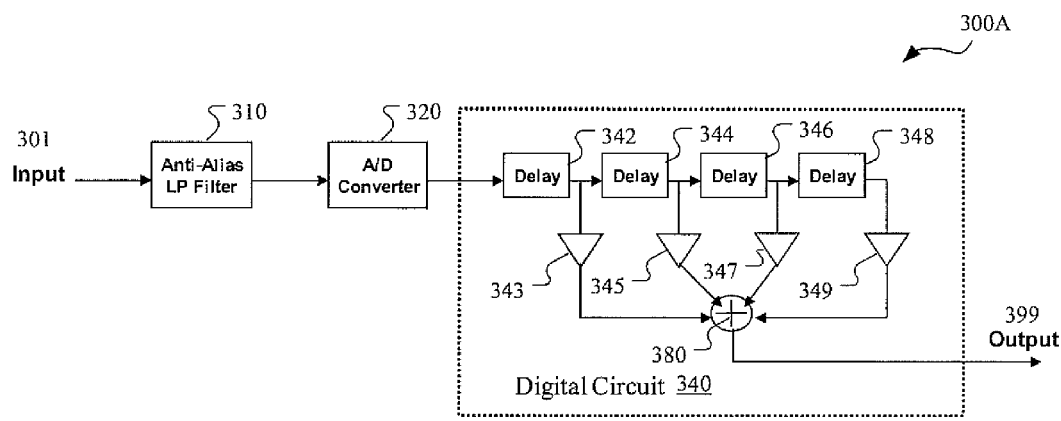
FIG. 3A shows a conventional adaptive finite impulse response (FIR) filter.
Figure 3B:
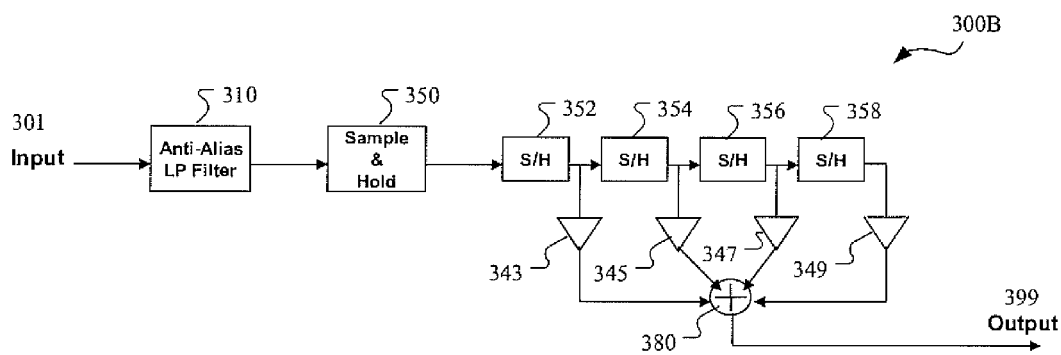
FIG. 3B shows another conventional adaptive FIR filter.
Figure 4A:
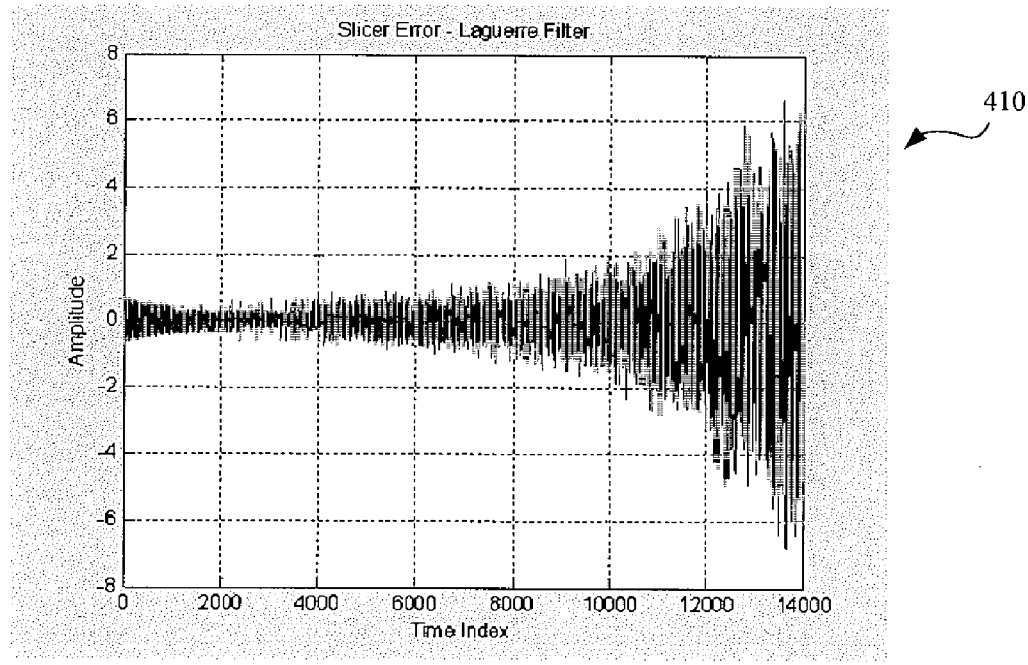
FIG. 4A shows a graph of simulated results of a DSP adaptation of a normalized Laguerre filter performed at a normalized time base $T_s=1$.

FIGS. 3A, 3B, and 4A illustrate aspects of conventional adaptive finite impulse response (FIR) filters. FIG. 3A shows a conventional adaptive FIR filter 300A. The FIR filter 300A of FIG. 3 generally receives an input signal 301 and delivers an output signal 399. The FIR filter 300A may include (or be used in conjunction with) an anti-alias low pass (LP) filter 310, an analog to digital (A/D) converter 320, and a digital circuit 340. The digital circuit 340 includes delay elements 342, 344, 346, and 348 of a tapped delay line; amplifier or coefficient elements 343, 345, 347, and 349; and summation circuit 380. Once the analog input signal is converted to a digital signal (having n bits), the digital signal is stored in the flip-flop. The width of the flip-flop bus is the same as the number of bits in the digital signal generated by the A/D converter 320. The stored digital word is multiplied with a coefficient.

The adaptive FIR filter 300A of FIG. 3 has been used for many applications that require high performance equalization for relatively lower speeds (e.g., up to 800 Mbaud applications). When signaling speed is higher than several GBaud (symbol/second) and accuracy of the signal processing has to be maintained, power consumption by the A/D converter 320 and the digital multiplier is generally more than the system can tolerate (because these prior art filters have not previously been manufactured/designed using conventional complementary metal oxide (CMOS) IC technology).

FIG. 3B shows another conventional adaptive FIR filter 300B. The FIR filter 300B of FIG. 3B includes certain features similar to FIR filter 300A of FIG. 3A, except the FIR filter 300B utilizes sample and hold circuitry to create delay. As shown, a main sample and hold element 350 is included along with several sample and hold elements 352, 354, 356, 358 on a delay line. One problem with such a design is that the linearity of sample and hold circuitry necessary to maintain the speed and accuracy of the FIR filter is not feasible—even with advanced process technology at very high speeds. Moreover, the sample and hold implementation suffers from excessive switching noise at multi-GHz operating frequencies.

Because both FIR filter 300A, 300B use sampled signal processing, insufficient settling time also presents a problem when attempts are made to use such filters in higher speed applications.

Another conventional FIR filter is described in the PhD Dissertation of Jui-Kuo Juan, entitled "Analog implementations of Locally Recurrent Adaptive Filters," (University of Florida, 1998). This document describes the use of Laguerre polynomials for an analog adaptive filter. Certain deficiencies exist in designs based on Laguerre polynomials, for example, as described below with reference to a feedforward equalizer (FFE) example.

A general objective of any proposed analog adaptive filter is the capability to work in conjunction with, and/or be directly coupled to, digital signal processing (such as in a DSP), where operations are executed at a given clock rate $T_s$ generally normalized to 1. Conventional structures based on Laguerre polynomials cannot be directly applied or coupled to/with DSP, due to the analog processing and DSP clock time-base disparity (misalignment), which results in filter adaptation failure.

FIG. 4A shows a graph 410 of simulated results of a DSP adaptation of a normalized Laguerre filter performed at a normalized time base $T_s=1$. As seen in the graph 410, a Laguerre filter results in miss-convergence when coupled with the same time-base DSP adaptation. The adaptation error amplitude increases as time progresses. When a higher order analog-digital co-processing is required, the aforementioned time based disparity cannot be properly addressed by a simple pole frequency scaling.

The proper solution to one-to-one, analog-to-digital time base correspondence may be established by certain embodiments of the disclosure employing adaptive analog filter structure blocks based on the Padé rational transfer functions. In most basic cases, a first order approximation may be sufficient. For increased accuracy in analog-to-digital time base processing, second and possibly higher order sections could be employed. The first to third order Padé approximations of a unity time interval are given below:

$$T^{(1)}(s) = \frac{2-s}{2+s} \tag{8}$$

$$T^{(2)}(s) = \frac{12 - 6s + s^2}{12 + 6s + s^2} \tag{9}$$

$$T^{(3)}(s) = \frac{120 - 60s + 12s^2 - s^3}{120 + 60s + 12s^2 + s^3} \tag{10}$$

where the superscript in the brackets indicate the Padé section order.

Figure 4B:
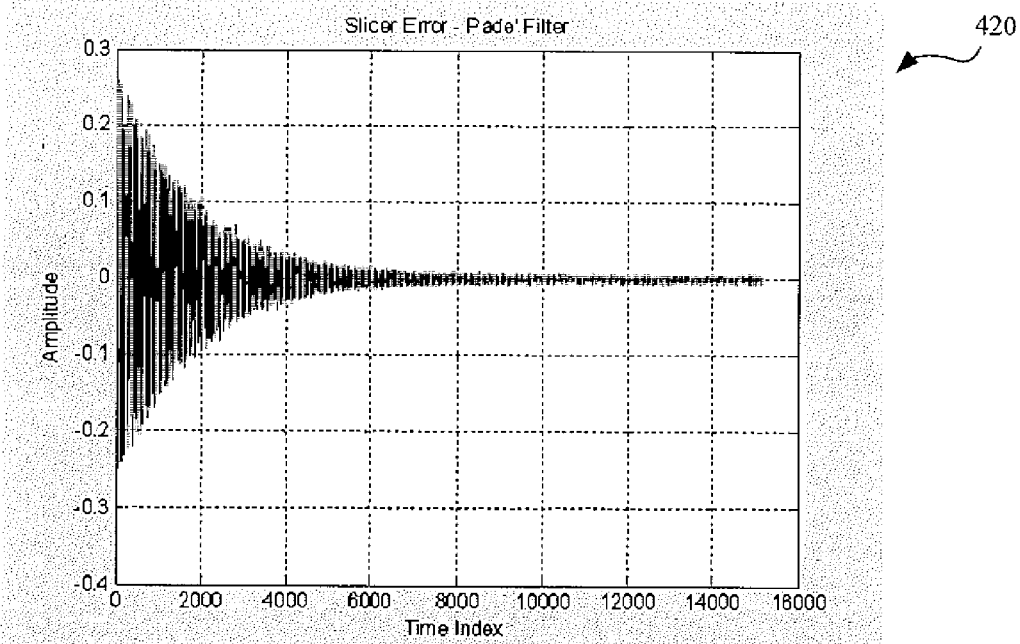
FIG. 4B shows a graph with an application of the Padé section transfer function.

By employing the Padé section transfer function (TF), the reciprocity in analog-to-digital processing time base is always guaranteed along with the robust analog filter adaptation, for example as shown by simulated results in graph 420 in FIG. 4B. As seen in the graph, the adaptation error amplitude decreases with time.

When the transfer function is known, Laguerre-based methods (e.g., as described in Jui-Kuo Juan's PhD Dissertation entitled "Analog implementations of Locally Recurrent Adaptive Filters") will approximate the target response correctly. However, as in the example described above, when the target response is unknown and if it has to be solved by the adaptive coefficient converging process, Laguerre-based methods are inadequate and do not work properly.

As described below, Padé based structures according to particular embodiments work well with synchronized DSP blocks because these structures create unit delay (Ts) with any order of approximation shown in equations 8, 9, and 10 above.

To combat some of the difficulties with certain conventional designs, certain embodiments disclosed herein utilize a continuous analog delay circuit. The amount of time delay created by the delay circuits can be designed based on the values of, among other components, resistors, capacitors, and inductors. Recent integrated circuit (IC) process technologies enable the control of components within a 20% tolerance without any calibration. Certain embodiments disclosed herein work well within such a 20% tolerance. When more precision than a 20% tolerance is required, certain embodiments utilize a resistor-capacitor (RC) time constant tunable with conventional circuit technology, such as a Gm-C filter technique.

Figure 5:
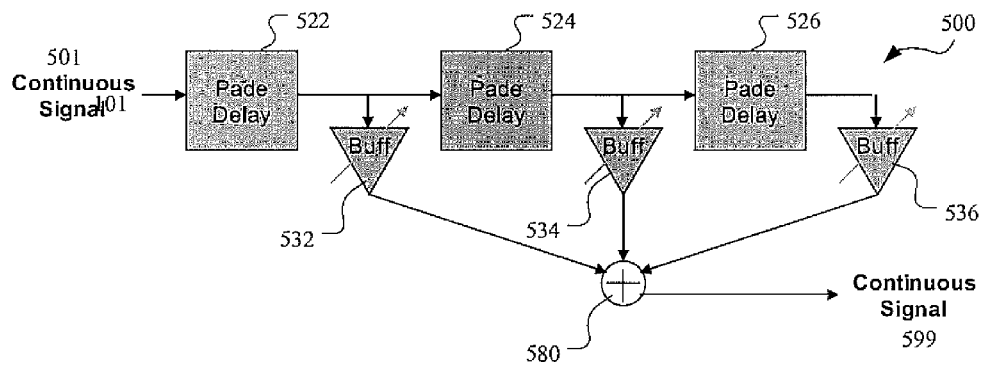
FIG. 5 shows a block diagram of an FIR using Padé delay, according to an embodiment of the disclosure.

FIG. 5 shows a block diagram of a FIR filter 500 using Padé delay, in accordance with an embodiment of the disclosure. As shown in FIG. 5, a continuous input signal 501 is input to the FIR filter 500 and a continuous output signal 599 is generated by the FIR filter 500. In this particular embodiment, a tap delay line in the FIR filter 500 includes three Padé delay elements 522, 524, and 526 along with three analog gain amplifiers or buffers 532, 534, and 536. The output of the buffers 532, 534, and 536 are input to a summation element 580, which yields the continuous output signal 599.

Although only three Padé delay elements and corresponding buffers have been shown in this embodiment, more than three and less than three of each respective component may be utilized in other embodiments. Additionally, other components (not shown in FIG. 5) may be incorporated in other embodiments. Furthermore, in addition to a direct form, the FIR filter may have a transposed form.

Figure 6A:
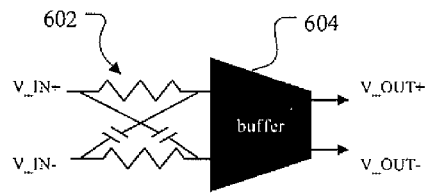
FIG. 6A shows a delay line, according to an embodiment of the disclosure.

FIG. 6A shows an example of a first order approximation delay element, according to an embodiment of the disclosure. As seen in FIG. 6A, the delay element is implemented by a cross-coupled passive resistor-capacitor (RC) 602 between V_IN+ and V_IN−. V_OUT+ and V_OUT− are shown after the buffer 604.

Figure 6B:
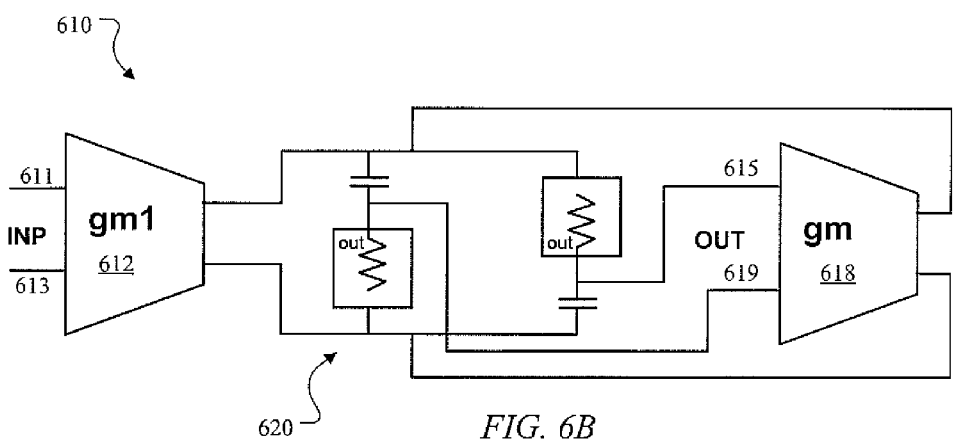
FIG. 6B shows a delay circuit cell, according to an embodiment of the disclosure.

FIG. 6B is a block diagram of an all-pass Padé filter cell 610, according to an embodiment of the disclosure. The Padé filter cell 610 of FIG. 6B includes a first input gm cell 612, two cross-coupled RC strings 620 and a load gm cell 618. The load cell 618 is used to equalize the effect of the first gm cell 610 within the whole frequency range. In order to accomplish this, the gm value of the load cell and 1/r of the resistor cell should be equal to each other. The input nodes 611, 613 of the Padé cell 610 are the inputs of the first gm cell 612, the output nodes 615, 619 are the inputs of the second gm cell 618. If two or more input gm cells are connected in parallel with separated inputs, the Padé filter cell 610 will perform an adding function as well, and can be used in the transposed configuration of the Feedforward Equalizer (FFE).

Figure 6D:
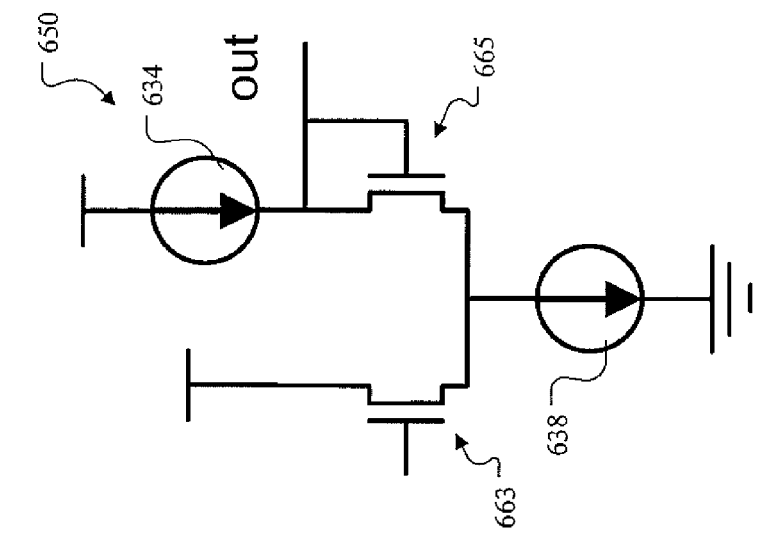
FIG. 6D is a diagram of a circuit for a simplified implementation of a gm cell, according to an embodiment of the disclosure.
Figure 6C:
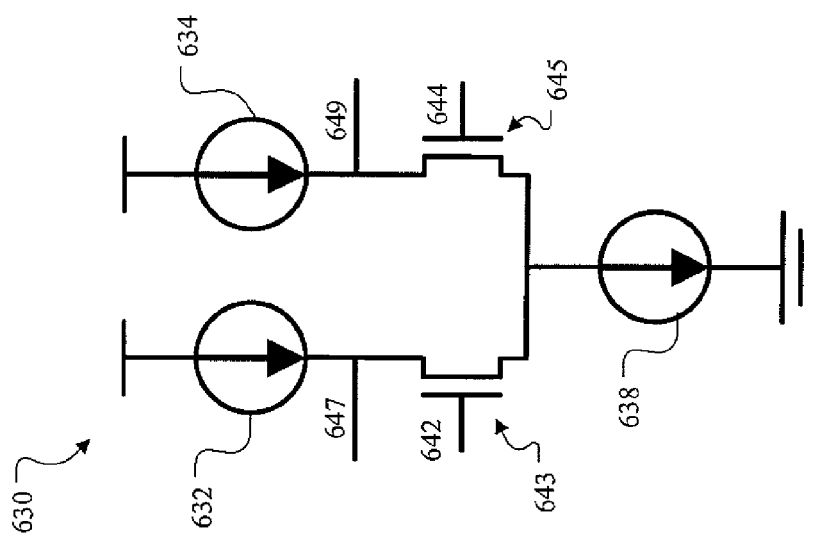
FIG. 6C is a block diagram of an all-pass Padé filter cell, according to an embodiment of the disclosure.

FIG. 6C is a detailed circuit diagram illustrating one embodiment of a gm cell 630 that can be utilized for the gm cell(s) in FIG. 6B This is a conventional circuit which includes two load current sources 632, 634, one tail current source 638, and a differential pair of NMOS transistors 643, 645. The input nodes of the cell 630 are the gates 642, 644 of the NMOS transistors 643, 645. The cell output nodes 647, 649 are coupled to the drains of the transistors. A common mode control circuit may be utilized for some circuits using such gm cells. Such common mode control circuits are commonly utilized in the industry and known to those skilled in the art, and therefore, no further description of such control circuit(s) is provided.

FIG. 6D is a detailed circuit diagram illustrating one embodiment of a resistor cell 650, according to an embodiment of the disclosure. The resistance value of the cell 650 is equal 2/gm of one of the NMOS transistors of the differential pair 663, 665. The node marked as "out" corresponds to the respective node of FIG. 6B. Only this node acts as a virtual resistor. Because the other node of the resistor element is connected to the gate of the NMOS transistor, it does not introduce any impedance in the network.

Figure 6E:
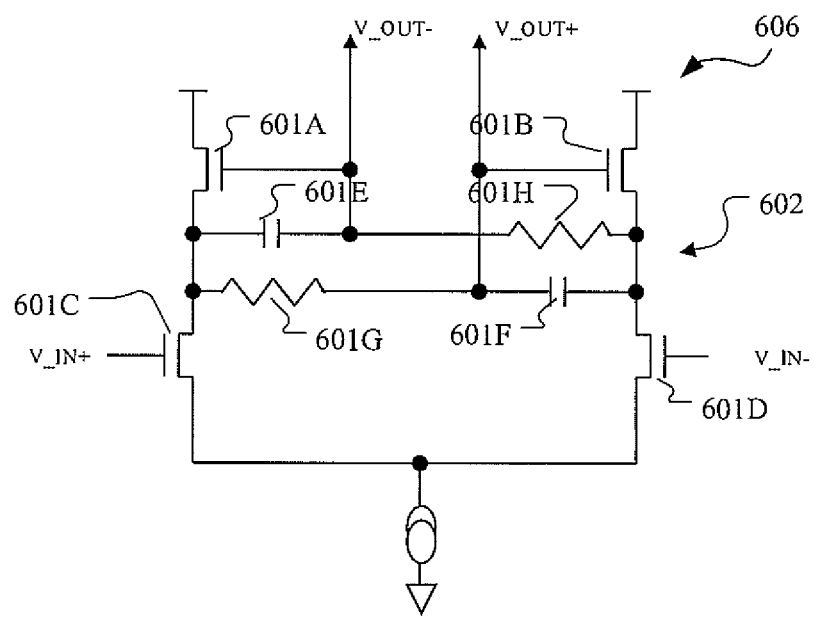
FIG. 6E shows a circuit diagram of a resistor cell, according to an embodiment of the disclosure.

FIG. 6E illustrates a delay circuit cell 606, according to an embodiment of the disclosure. FIG. 6E is just one example of multiple possible transistor level implementations of the block diagram of the all-pass Padé filter cell 610 in FIG. 6B. As shown in FIG. 6E, the circuit cell 606 includes transistors 601A, 601B, 601C, 601D; capacitors 601E, 601F; and resistors 601G, 601H with V_IN+, V_IN−, V_OUT+, and V_OUT−, respectively, shown. Multiplication may be done with the analog gain amplifier or buffer in which gain is controlled by one or more coefficients.

Figure 6F:
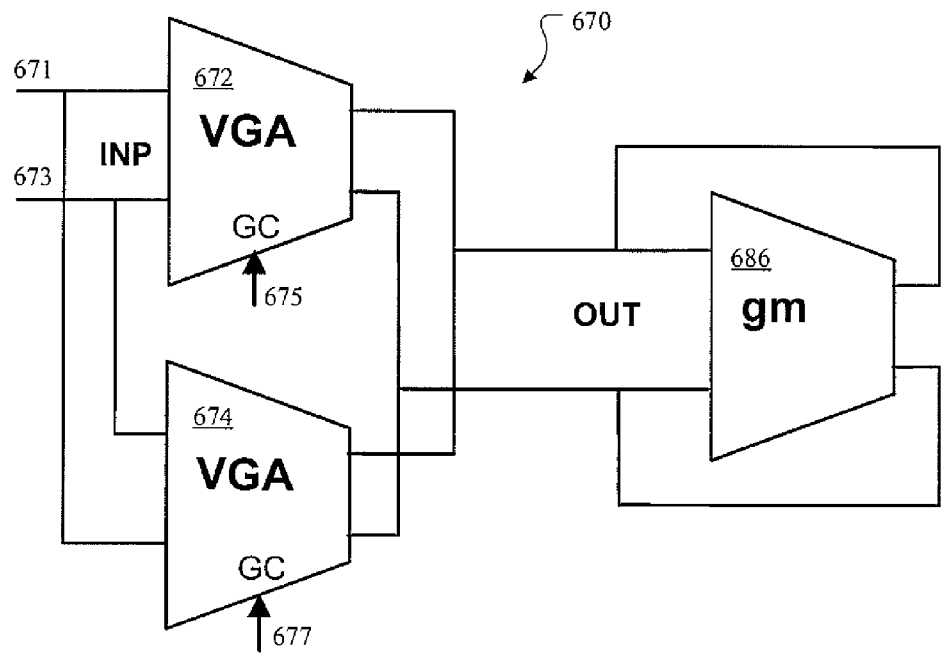
FIG. 6F show a block diagram of a multiplier cell (also referred to as a variable gain amplifier (VGA)), according to an embodiment of the disclosure.

FIG. 6F is a block diagram of a multiplier cell 670 (also referred to as a variable gain amplifier (VGA)), according to an embodiment of the disclosure. The multiplier cell 670 includes two cross-coupled VGA cells 672, 674 with common differential inputs 671, 673 and a shared load (resistive). The load is configured as a gm cell 686 connected in 100% feedback configuration in this embodiment. The sign and the value of the multiplier cell 670 are set by the voltage difference of the gain control (GC) inputs 675, 677 of the VGA cells 672, 674. If the gain control inputs of both VGA cells 672, 674 are equal, the combined gain of the multiplier cell is equal to "0."

Figure 6G:
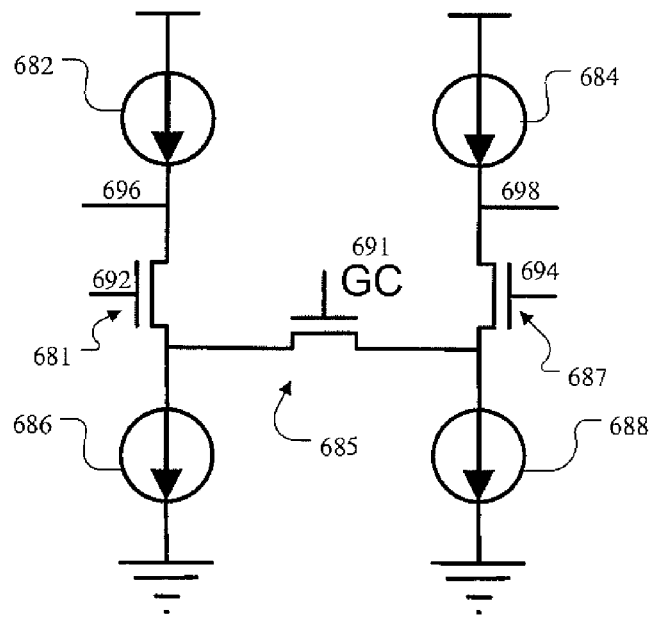
FIG. 6G shows a circuit diagram of a VGA cell, according to an embodiment of the disclosure.

FIG. 6G is a detailed circuit diagram illustrating a VGA cell 680 that can be utilized for the VGA cells in FIG. 6F, according to an embodiment of the disclosure. Compared to a regular gm cell, the VGA cell 680 includes two tail current sources 686, 688 (in addition to the two load current sources 682, 684) and an additional NMOS transistor 685 degenerating the gm value of the pair of differential NMOS transistors 681, 687. The amount of degeneration is set by the gate-channel voltage 691 of the additional NMOS transistor 685. Respective inputs 692, 694 and outputs 696, 698 are also shown.

The s-domain transfer-function of a delay circuit or element, according to certain embodiments of the disclosure, is described in the equation (11).

$$T(s) = \frac{a - \frac{s}{wo}}{\frac{s}{wo} + a} \quad (11)$$

where,
T(s) is the transfer-function of the delay element,
s=j*w,
wo=2.*pi*fo,
a=constant coefficient
where,
pi=3.1416
fo is the inverse of the unit time delay.

The above equation is derived from a Padé approximation described in the book entitled "*Essentials of Padé Approximants in Theoretical Physics*" by Baker, G. A. Jr. (New York: Academic Press, 1975) at pp. 27-38. Particular embodiments of the disclosure include a method of implementing such a Padé approximation in an FIR filter application.

The following are several non-limiting example implementations of Padé-based elements. Although these examples will be provided, it should be understood that other implementations may avail from teachings of the disclosure.

Example 1

Feedforward Equalizer (FFE)

FIGS. 7-10 are examples of different implementations in a feedforward equalizer (FFE). When certain teachings of the disclosure are utilized in an FFE implementation, the constant coefficient "a" determines the structure of the FFE. For example, teachings of the disclosure may be used to create (generate or configure) a symbol spaced FFE when a=2 and may also create a fractional spaced FFE when a<2.0. The following non-limiting examples use a=2. Other embodiments may have values of "a," for example, less than 2.

Figure 7:
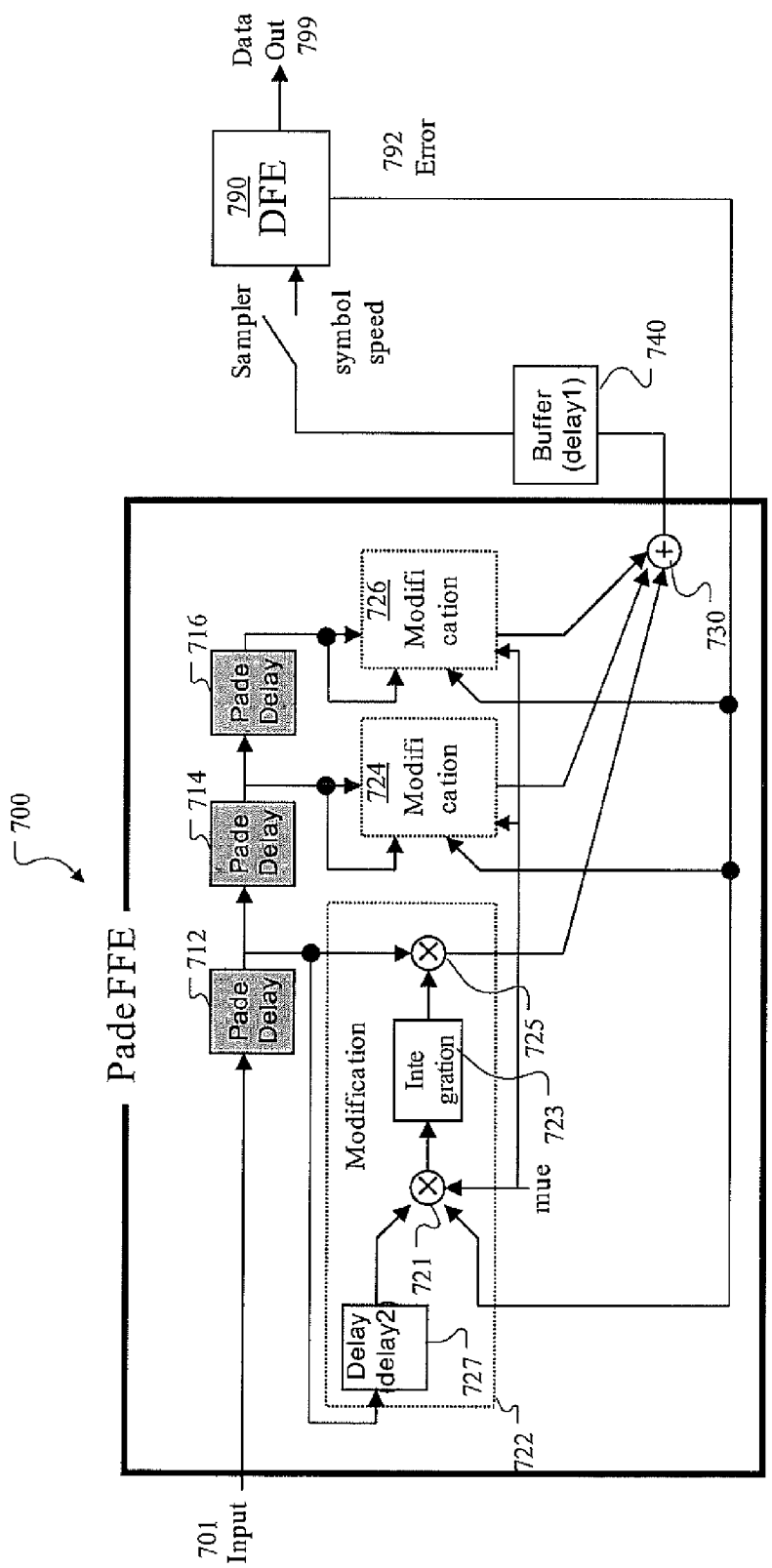
FIG. 7 is a block diagram of an feedforward equalizer (FFE), according to an embodiment of a disclosure.

Now turning to FIG. 7, there is shown a block diagram of an FFE 700 according to one embodiment. The FFE 700 in this embodiment includes three Padé delay elements 712, 714, and 716; modification elements 722, 724, and 726; and a summation element 730.

For brevity, details of only one of the modification elements 722 are illustrated. As will be appreciated, the other modification elements 724, 726 may have similar components as modification element 722. The modification element 722 is shown with multiplier elements 721, 725; integration component 723, and a delay component 727. Before being input to integration component 723, the multiplication elements 721 receive three signals: (1) a signal from the delay component 727, (2) an error signal 792 (discussed below), and (3) a coefficient, mue, which is associated with what is commonly referred to as the adaptation step.

In particular applications, a decision feedback equalizer (DFE) 790 may be incorporated. An example of a DFE is described in the book entitled "Digital Communication" by Edward A. Lee and David G. Messerschmitt, Kluwer Academic Publishers in chapter 9.3 "Adaptive DFE References" and is incorporated herein by reference.

From the summation element 730, the signal enters a buffer element 740 and is input to the DFE 790. The DFE 790 makes a data decision after canceling post-cursor intersymbol interference (ISI) and generates the error signal 792. The error signal 792 may be generated by subtracting decision data from the input of the data comparator. The FFE coefficient adaptation is accomplished by the correlation between the error signal 792 generated by the DFE 790 and input signal 701 to the FFE. The error signal 792, respectively, may be fed back to each of the modification elements 722, 724, and 726.

There are several convergence algorithms that may be utilized. Minimum mean square error (MMSE)—as described in the book entitled "Digital Communication" by Edward A. Lee and David G. Messerschmitt, Kluwer Academic Publishers in chapter 9.3 "Adaptive DFE References."—is used in this example. The error signal 792 is correlated with the delayed signal in the Padé delay element. The amount of delay, delay2, applied to the signal is adjusted to the total delay between the sampler prior to the DFE and FFE, delay1.

Figure 8:
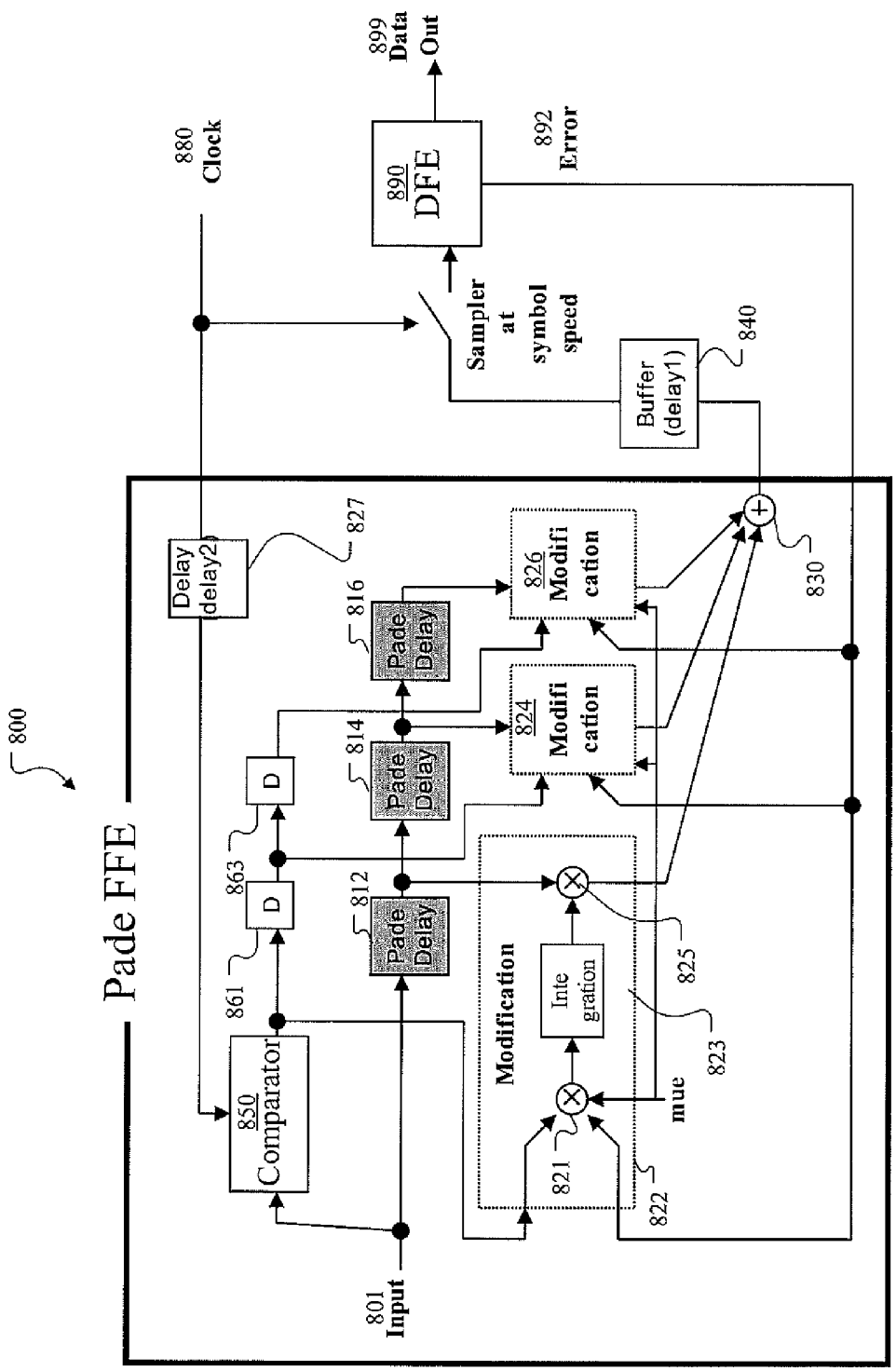
FIG. 8 is a block diagram of another FFE, according to another embodiment of the disclosure.

FIG. 8 is a block diagram of an FFE 800 according to another embodiment. The FFE 800 of FIG. 8 includes features similar to the FFE 700 of FIG. 7, including Padé delay elements 812, 814, 816; modification elements 822, 824, and 826 (with details of one modification element 822 including multiplier elements 821, 825 and integration component 823, and mue); and a summation element 830. Additionally, the FFE 800—like the FFE 700 of FIG. 7—may be used in conjunction with a buffer element 840 and a DFE 890 that generates an error signal 892. However, the input signal 801 is sampled by a clocked-comparator 850 and only polarity is fed to the delay line. Accordingly, as seen in FIG. 8, a portion of the signal input to the modification elements 822, 824, and 826 comes from the comparator 850. Additionally, as shown, the delay component 827 is not contained with the modification elements 822, 824, and 826. The output line of the comparator 850 may additionally contain delay elements 861, 863.

The delay line is implemented with a flip-flop that is clocked with the same sampling clock 880 fed to the comparator 850. The sampling clock 880 includes the same amount of delay as delay2. Comparator 850 generates the polarity of the input signal, sign(data), and they are used for the correlation. This example uses the sign algorithm; however, a normal adaptation (none-sign) can be used by replacing the clocked-comparator 850 with the sampler.

Figure 9:
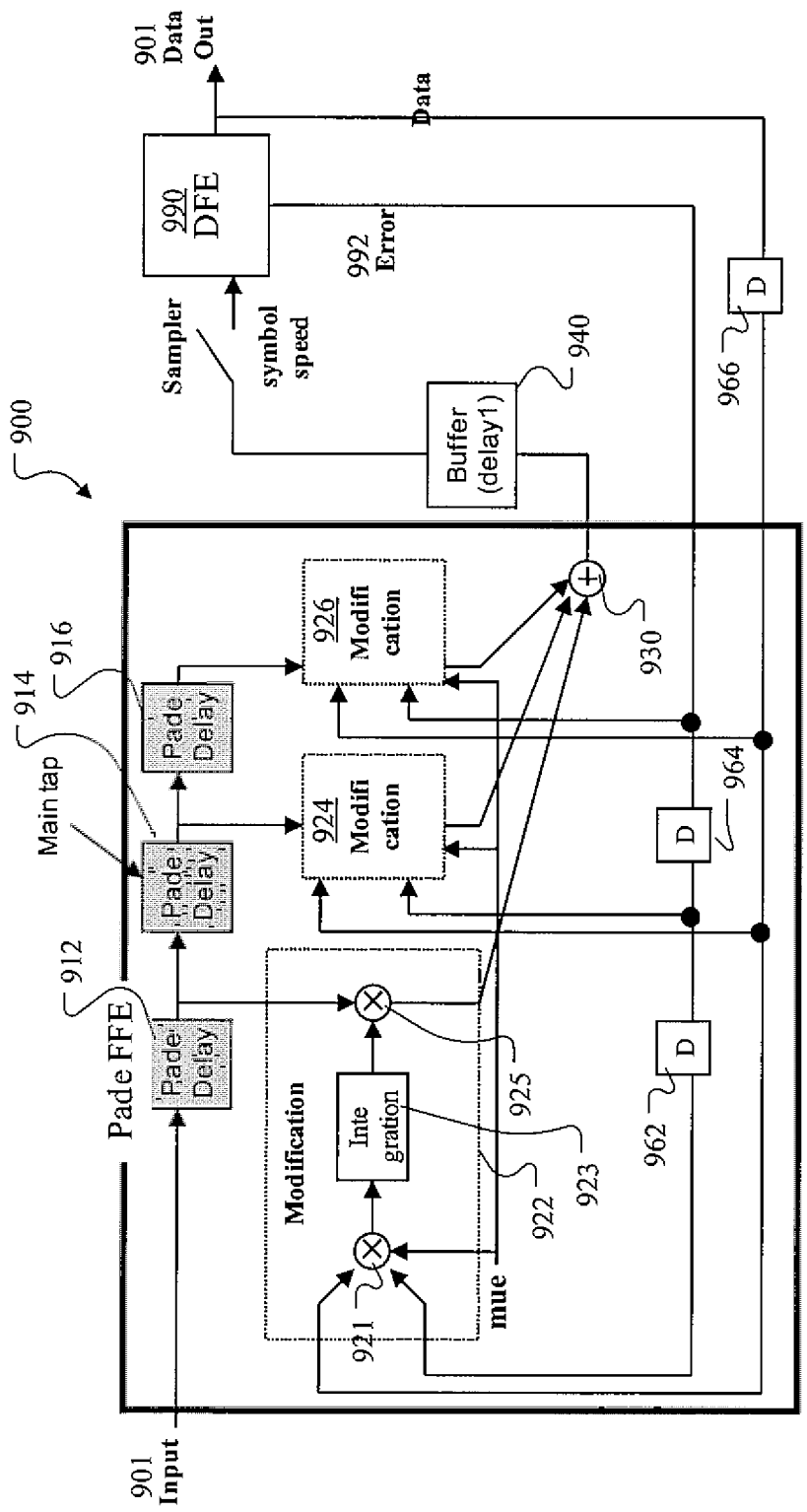
FIG. 9 is a block diagram of another FFE, according to another embodiment of the disclosure.

FIG. 9 is a block diagram of a FFE 900 according to another embodiment. The FFE of FIG. 9 includes features similar to the FFE 700 of FIG. 7, including Padé delay elements 912, 914, and 916; modification elements 922, 924, and 926 (with details of one modification element 922 including multiplier elements 921, 925 and integration component 923, and mue); and a summation element 930. Additionally, the FFE 900—like the FFE 700 of FIG. 7—may be used in conjunction with a buffer element 940 and a DFE 990 that generates an error signal 992.

In FIG. 9, a zero forcing algorithm is used to adapt the FFE 900. This method has the advantage of not using the analog signal to adapt the coefficient since the position of the main tap (normally the biggest value of the coefficient) has to be assigned. In the error signaling return line, two delay elements 962, 964 are shown. Additionally a data signal return line with delay element 966 is also shown.

Figure 10:
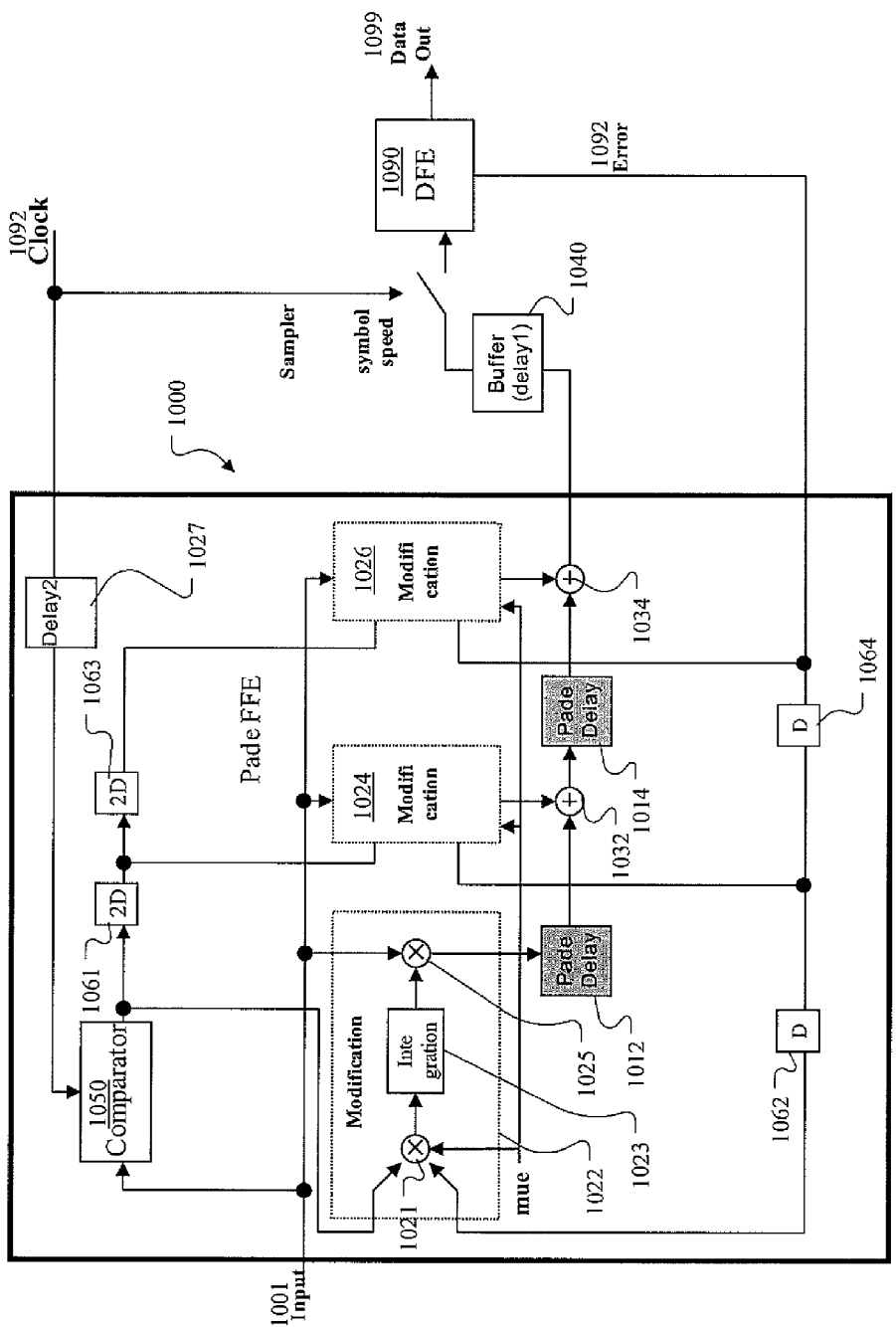
FIG. 10 is a block diagram of another FFE, according to another embodiment of the disclosure.

FIG. 10 is a block diagram of a FFE 1000 according to another embodiment. Some of the components of the FFE 1000 are similar to those described with FIGS. 7-9, including Padé delay elements 1012 and 1014; modification elements 1022, 1024, and 1026 (with details of one modification element 1022 including multiplier elements 1021, 1025 and integration component 1023, and mue); a clock 1092; a comparator 1050, and delay elements 1062, 1064, 1061, 1063. Additionally, the FFE 1000—like the FFEs 700, 800, 900 of FIGS. 7-9—may be used in conjunction with a buffer element 1040 and a DFE 1090 that generates an error signal 1092. However, the FFE 1000 is a transposed FIR and its adaptation method uses the sign(data) algorithm. Thus, two summation elements 1032, 1036 are provided.

All the above-described configurations in FIGS. 7-9 such as direct form or transposed form, MMS or ZF, sign algorithm for data and error can be combined with any combinations.

Example-2

Transmit Equalizer

Figure 11:
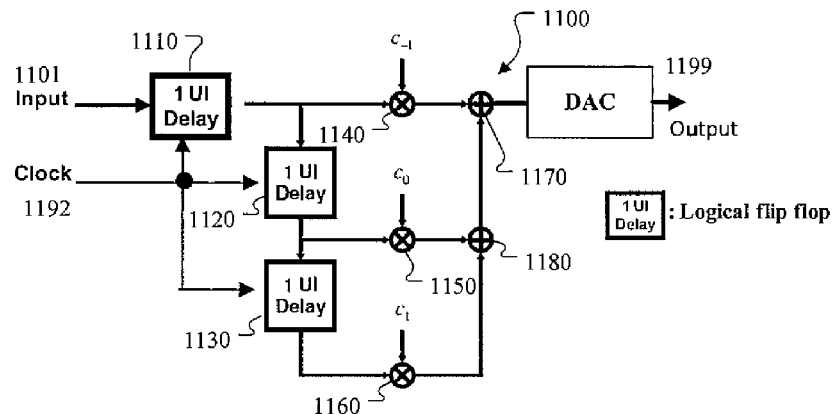
FIG. 11 shows a conventional structure of a transmit equalizer used for a high speed digital transmission system.
Figure 12:
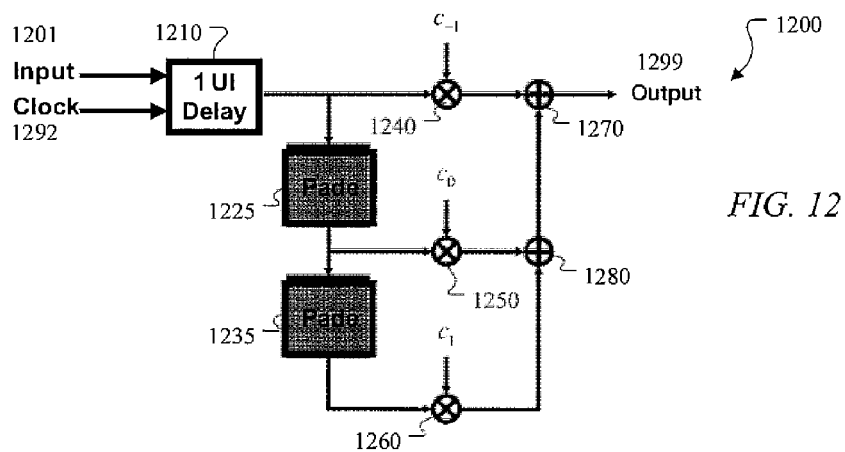
FIG. 12 shows a transmit equalizer, according to an embodiment of the disclosure.
Figure 13:
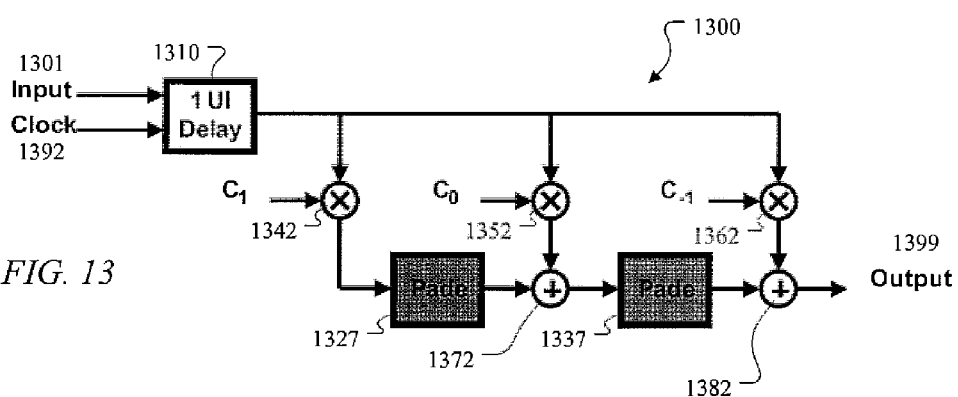
FIG. 13 shows another transmit equalizer, according to an embodiment of the disclosure.

FIGS. 11-13 are examples of different implementations in a transmit equalizer.

FIG. 11 shows a conventional structure of a transmit equalizer 1100 that may be utilized for a high speed digital transmission system. The transmit equalizer 1100 of FIG. 11 includes three delay elements 1110, 1120, and 1130; three multiplier elements 1140, 1150, and 1160; and two summation elements 1170, and 1180 that receive an input signal 1101 and outputs an output signal 1199. In FIG. 11, the delay line is implemented with a digital circuit. Since the conventional method uses a flip-flop in the delay line, each flip-flop is provided with an accurate clock 1192. Any jitter of the clock modulates the transmit data and causes jitter in the transmitted signal. Also, importantly, a jitter due to the data pattern will additionally degrade the transmit signal. The delay and the transient response of the rising and falling edge of the flip-flop are different. This is called duty cycle distortion and has to be minimized.

FIG. 12 illustrates a transmit equalizer 1200 according to one embodiment of the disclosure. The transmit equalizer 1200 of FIG. 12 is shown in a direct-form configuration, incorporating Padé delay elements 1225, 1235; a delay element 1210; three multiplier elements 1240, 1250, 1260; and two summation elements 1270 and 1280 for receiving an input signal 1201 and outputting an output signal 1299. Unlike the conventional transmit equalizer 1100 of FIG. 11, the transmit equalizer 1200 does not require the clock 1292 except for the first flip-flop (delay element 1210). Accordingly, jitter and/or distortion can be reduced. Additionally, power consumption can be reduced.

FIG. 13 illustrates transmit equalizer 1300 according to another embodiment of the disclosure. The transmit equalizer of FIG. 13 is similar to the transmit equalizer 1200 of FIG. 12, including Padé delay elements 1327, 1337; delay element 1310; three multiplier elements 1342, 1352, 1362; and two summation elements 1372 and 1382 for receiving an input signal 1301 and outputting an output signal 1399, and utilizing the clock 1392 for the first flip-flop. However, the transmit equalizer 1300 of FIG. 13 is in a transposed-form configuration. Similar to that described in FIG. 12 but unlike the conventional structure described in FIG. 11, the transmit equalizer 1300 of FIG. 13 is configured to only include the clock 1392 input to the first flip-flop (delay element 1310). Accordingly, jitter, distortion and/or power consumption may be reduced.

Example 3

FEXT Canceller

Figure 14:
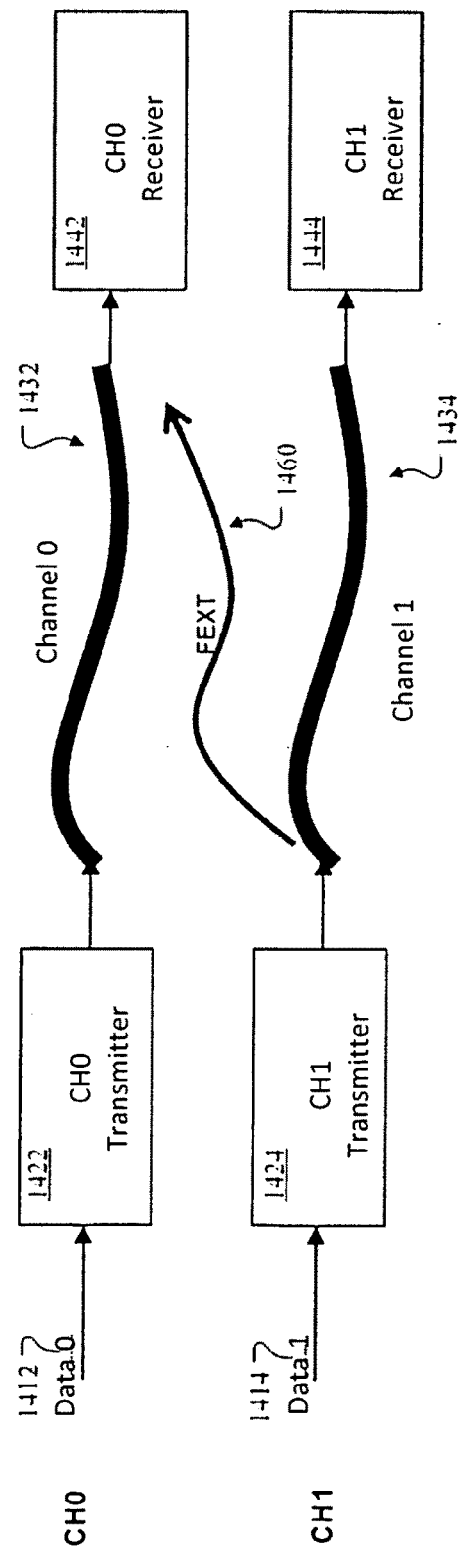
FIG. 14 shows an example of far-end cross talk (FEXT) between two respective channels.
Figure 15:
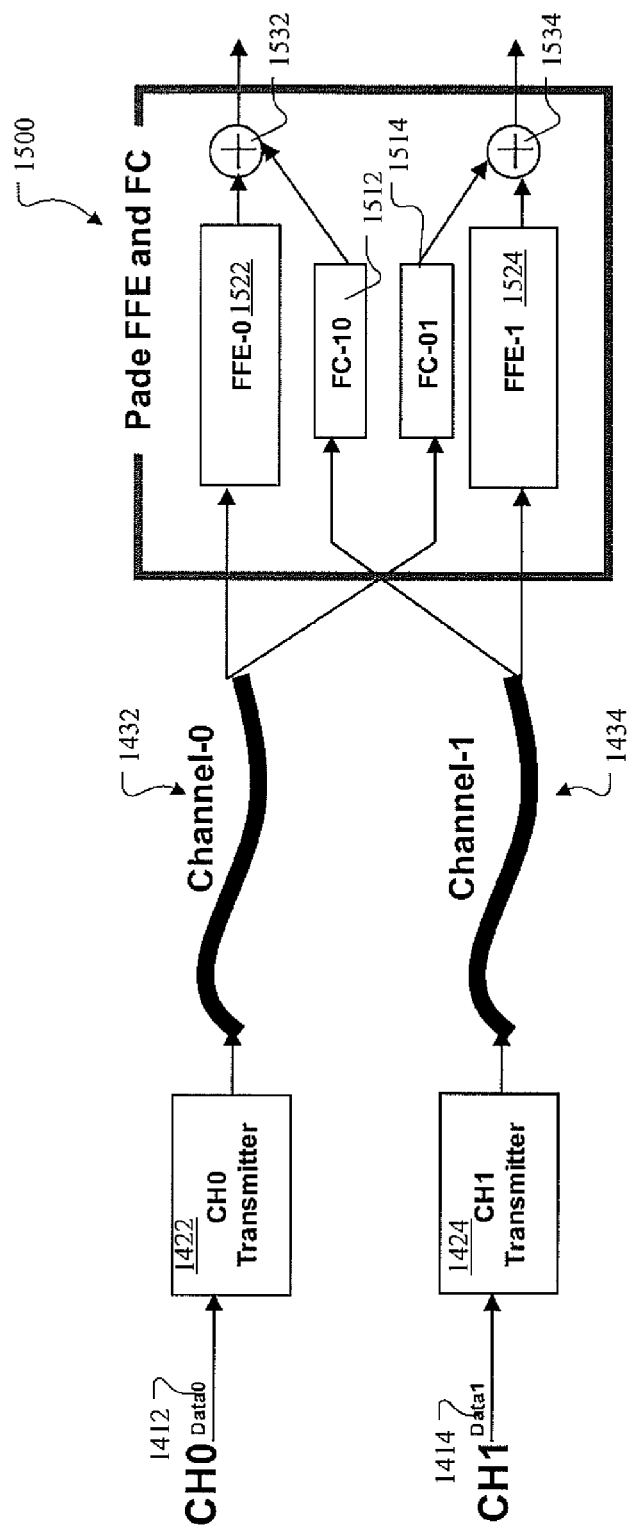
FIG. 15 is a block diagram of a FEXT canceller system, according to an embodiment of the disclosure.
Figure 16:
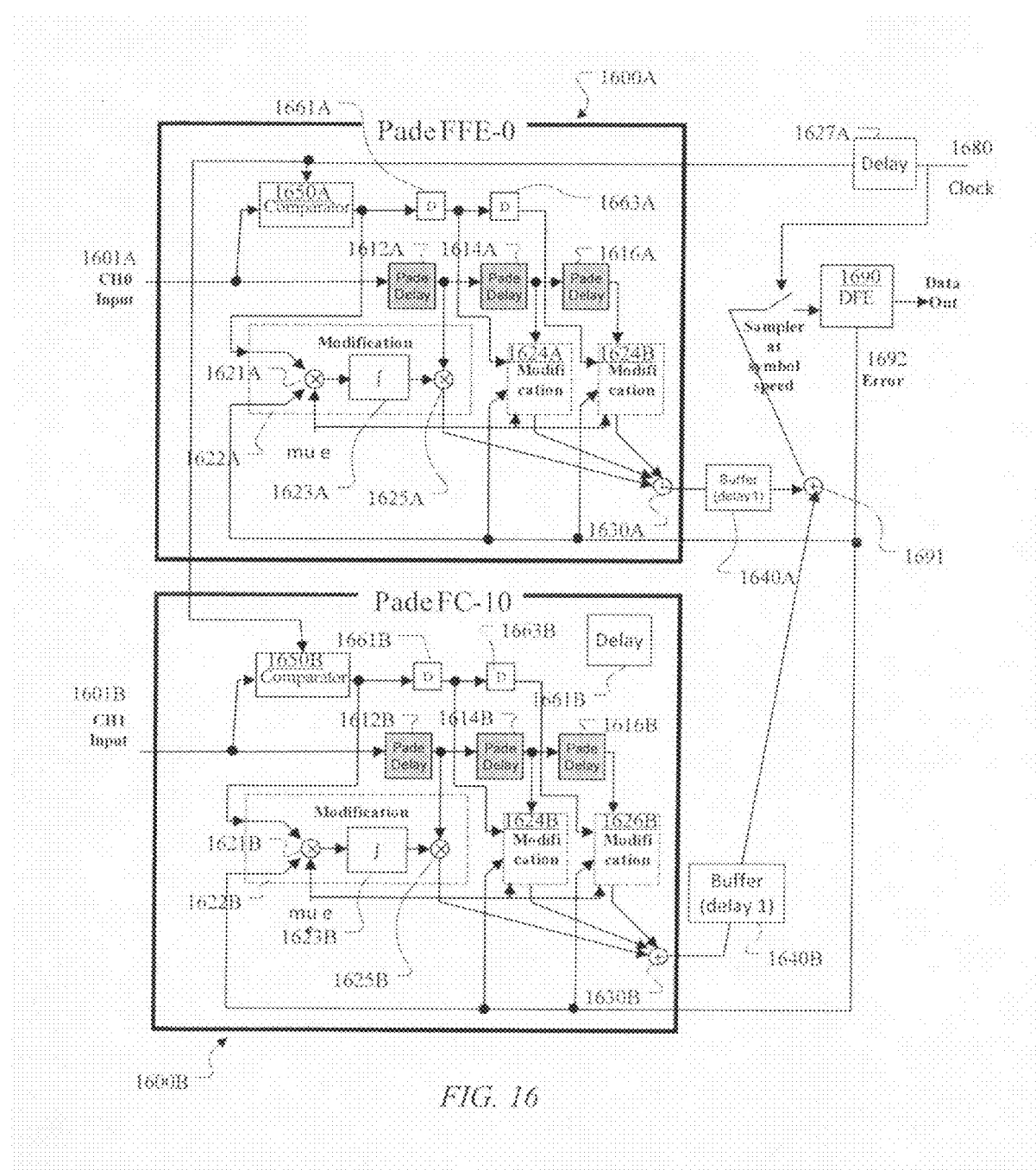
FIG. 16 shows more details of a portion of the block diagram of FIG. 15.

FIGS. 14-16 are examples of different implementations in a far end cross talk (FEXT) canceller (FC).

FIG. 14 shows an example of far-end cross talk between two respective channels. When a very high-speed data is to be transmitted from one point to another point, more than one transmission channel (parallel transmission) is installed to reduce the data rate on the individual channel. FIG. 14 shows components for channels, CH0 and CH1. The components for each respective channel include the transmitted data 1412, 1414; transmitters 1422, 1424; the channels 1432, 1434; and receivers 1442, 1444.

Typically, channels 1432, 1434 share the same connectors and are installed in the same cable bundling. Accordingly, crosstalk noise from one channel to another becomes a serious problem. The crosstalk noise in the FIG. 14 is called Far-End crosstalk (FEXT) 1460. The FEXT is defined as the forward directional noise from one channel to others (e.g., CH1 transmitter 1424 to CH0 receiver 1442 or CH0 transmitter 1422 to CH1 receiver 1444) while the near-end crosstalk noise (NEXT) is defined as the backward directional noise from CH0 transmitter to CH1 receiver.

Both FEXT and NEXT are understood as the signal leakage from one channel to others and they become serious impairments when the data speed increases because crosstalk coupling is greater at higher frequencies. A method of canceling FEXT, according to certain embodiments of disclosure, is described below.

When more than one lane (channel) is used for the transmission system, it is called multi-input, multi-output (MIMO). Padé filter applications in MIMO, according to certain embodiments of the disclosure, are described below.

FIG. 15 is a block diagram of a FEXT canceller system 1500 according to one embodiment of the disclosure. Cross-coupled FIR filters may be added to the FFEs 1522, 1524. FC-10 1512 is the FEXT canceller from CH1 to CH0 and FC-01 1514 is the FEXT canceller from CH0 to CH1. The respective outputs from FFEs 1522, 1524 and the FCs 1512, 1514 may be combined with summation elements 1532, 1534.

FIG. 16 illustrates additional details of a portion of the block diagram of FIG. 15. The FC-10 (FC 1600B) uses error signal from the CH0 DFE and correlates with the data from the CH1. Furthermore, another half structure for CH1 uses the same clock with the one used for CH0. The components of FFE 1600A and FC 1600E are similar to the components described above with respect, for example, FIG. 8 including Padé delay elements 1612A, 1614A, 1616A, 1612B, 1614B, 1616B; modification elements 1622A, 1624A, 1626A, 1622B, 1624B, 1626B (with details of one modification element 1622A,1622B, respectively, including multiplier elements 1621A, 1621B, 1625A, 1625B and integration component 1623A, 1623B, and mue); summation elements 1630A, 1630B; comparators 1650A, 1650B; delay elements 1661A, 1663A, 1661B, 1663B. However, the same error signal 1692 is respectively input to the FFE 1600A, the FC 1600B and a summation element 1691 that combines signals from the FFE 1600A and the FC 1600B.

A clock can be recovered for one of the channels when teachings for this disclosure are used in a MIMO system. This is one of advantage of certain embodiments of the disclosure (e.g., Padé FFEs) as compared to conventional FFEs that need timing recovery for each channel. This is due to the fact that conventional baud spaced FFEs (sampled-based) have a dead zone where the FFE does not converge at certain range of the phase.

Furthermore, since the frequency of those MIMO lanes are identical and since Padé based FFE can work any phase at the decision node, certain embodiments of the disclosure provide a great benefit to simplify the timing recovery circuit. All it needs is the frequency recovering PLL that feeds timing information to all MIMO channels. This nature of a phase synchronous clocking system enables a reduction in inherent IC clock noise.

The aforementioned FEXT canceller can be used for copper cable and/or PCB transmission systems, and can also be used for optical fiber systems. For example, if the system utilizes wave difference multiplexing on a single fiber and two adjacent frequencies are close, then crosstalk from one frequency to another can result in FEXT. The Padé-based equalizer and/or FEXT canceller of the present disclosure can be applied to such optical fiber system to increase throughput or reduce the total cost.

Figure 17:
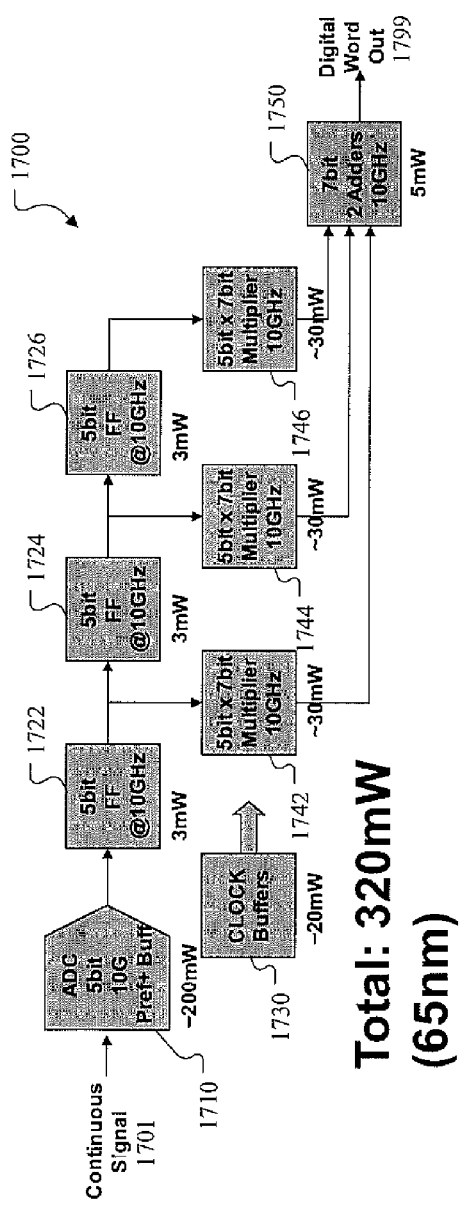
FIG. 17 shows a conventional FFE with a continuous signal input.
Figure 18:
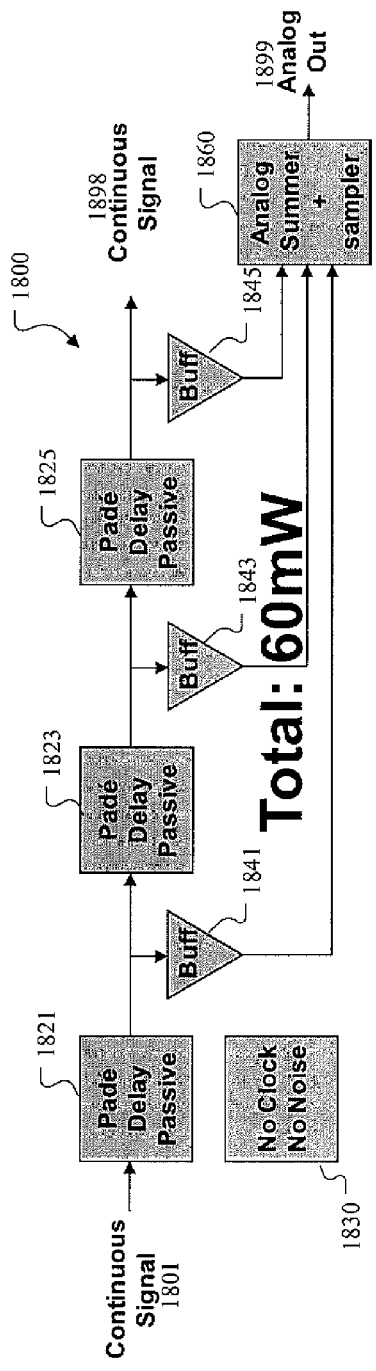
FIG. 18 shows an FFE, according to an embodiment of the disclosure.

FIGS. 17 and 18 show an example power comparison between conventional systems and an embodiment of the disclosure. FIG. 17 shows a conventional FFE 1700 with a continuous signal input 1701; an analog to digital converter 1710; a clock 1730; three delay elements 1722, 1724, 1726; there multipliers 1742, 1744, and 1746; an adder 1750, and digital word output signal 1799. Below each respective component is an estimation of power consumption. The sum of the power consumptions for the FFE 1700 of FIG. 17 is 320 mW.

FIG. 18 shows an FFE 1800, according to an embodiment of the disclosure. The FFE 1800 of FIG. 18 includes a continuous signal input 1801; three Padé delay elements 1821, 1823, and 1825; three buffers 1841, 1843, and 1845; a box 1830 indicating no clock and no noise; an analog summer/sampler 1860; a continuous signal output 1898; and an analog output signal 1899. The sum of the power consumptions for the FFE 1800 of FIG. 18 is 60 mW.

As seen through the comparison of FIGS. 17 and 18, certain embodiments dramatically reduce power consumption (320 mW of FIG. 17 vs. 60 mW of FIG. 18). Also, one can see that certain embodiments of the disclosure use continuous signal processing rather than sampled signal processing.

It will be understood that well known processes have not been described in detail and have been omitted for brevity. Although specific steps, structures and materials may have been described, the present disclosure may not be limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A communications receiver comprising:
   an adaptive filter configured to receive an input signal, the filter comprising a continuous analog delay circuit with a plurality of delay elements, wherein at least one of the plurality of delay elements is a Padé-based delay element, the adaptive filter is an adaptive feedforward equalizer, and the communications receiver further comprises,
   a decision feedback equalizer coupled to an output of the adaptive feedforward equalizer, the decision feedback equalizer configured to recover data carried by the input signal, and wherein the decision feedback equalizer additionally outputs an error signal that is returned to the adaptive feedforward equalizer for correlation with other signaling; and
   wherein the adaptive feedforward equalizer further comprises:
      a clocked comparator for sampling the input signal, and
      at least one modification element that receives at least (a) a signal from one of the delay elements, (b) a signal from a delay line from the clocked comparator, and (c) an error signal from the decision feedback equalizer, the at least one modification element outputting a signal derived from the received signals.

2. The communications receiver of claim 1, wherein the input signal is not used to adapt a coefficient for the adaptive feedforward equalizer.

3. A communications receiver comprising:
   an adaptive filter configured to receive an input signal, the filter comprising a continuous analog delay circuit with a plurality of delay elements, wherein at least one of the plurality of delay elements is a Padé-based delay element, the adaptive filter is an adaptive feedforward equalizer, and the communications receiver further comprises,
   a decision feedback equalizer coupled to an output of the adaptive feedforward equalizer, the decision feedback equalizer configured to recover data carried by the input signal, and wherein the decision feedback equalizer additionally outputs an error signal that is returned to the adaptive feedforward equalizer for correlation with other signaling; and
   wherein the adaptive feedforward equalizer further comprises:
      a clocked comparator for sampling the input signal, and
      at least one modification element that receives at least (a) the input signal, (b) a signal from a delay line from the clocked comparator, and (c) an error signal from the decision feedback equalizer, the at least one modification element outputting a signal derived from the received signals to at least one of the delay elements.

4. A communications receiver comprising:
   an adaptive filter configured to receive an input signal, the filter comprising a continuous analog delay circuit with a plurality of delay elements, wherein at least one of the plurality of delay elements is a Padé-based delay element, the adaptive filter is an adaptive feedforward equalizer, and the communications receiver further comprises,
   a decision feedback equalizer coupled to an output of the adaptive feedforward equalizer, the decision feedback equalizer configured to recover data carried by the input signal, and wherein the decision feedback equalizer additionally outputs an error signal that is returned to the adaptive feedforward equalizer for correlation with other signaling; and
   wherein the adaptive feedforward equalizer further comprises:
      at least one modification element that receives at least (a) two delayed signals from one of the delay elements and (b) an error signal from the decision feedback equalizer, the at least one modification element outputting a signal derived from the received signals.

5. A communications receiver comprising:
   an adaptive filter configured to receive an input signal, the filter comprising a continuous analog delay circuit with a plurality of delay elements, wherein at least one of the plurality of delay elements is a Padé-based delay element, the adaptive filter is an adaptive feedforward equalizer, and the communications receiver further comprises,
   a decision feedback equalizer coupled to an output of the adaptive feedforward equalizer, the decision feedback equalizer configured to recover data carried by the input signal, and wherein the decision feedback equalizer additionally outputs an error signal that is returned to the adaptive feedforward equalizer for correlation with other signaling; and
   wherein the adaptive feedforward equalizer further comprises:
      at least one modification element that receives at least (a) a delayed signal from one of the delay elements, (b) an error signal from the decision feedback equalizer, and (c) a data signal from the decision feedback equalizer, the at least one modification element outputting a signal derived from the received signals.

6. A communications receiver, comprising:
   a first feedforward equalizer configured to receive a first input signal from a first channel and a first error signal;
   a first crosstalk canceller configured to receive a second input signal from a second channel and the first error signal, the first crosstalk canceller having a continuous analog delay circuit including a plurality of delay elements, and the first crosstalk canceller correlating the second signal with the first error signal; and
   a first decision feedback equalizer coupled to an output of the first feedforward equalizer and an output of the first crosstalk canceller, the first decision feedback equalizer recovering data carried by the first input signal and generating the first error signal.

7. The communication receiver of claim 6, further comprising:
   a second feedforward equalizer configured to receive the second input signal and a second error signal;
   a second crosstalk canceller configured to receive the first input signal and the second error signal, the second crosstalk canceller having a continuous analog delay circuit including a plurality of delay elements, and the second crosstalk canceller correlating the first input signal with the second error signal.

8. The communication receiver of claim 6, wherein a clock is recovered for one of the channels.

9. The communication receiver of claim 7, further comprising:
a second decision feedback equalizer coupled to an output of the second feedforward equalizer and an output of the second crosstalk canceller, the second decision feedback equalizer recovering data carried by the second input signal and generating the second error signal.

10. The communication receiver of claim 7, wherein each of the first and second feedforward equalizers have a continuous analog delay circuit including a plurality of delay elements.

11. The communication receiver of claim 7, wherein at least one of the delay elements for each of the first and second feedforward equalizers and the first and second crosstalk cancellers is a Padé delay element.

12. The communication receiver of claim 6, wherein the first crosstalk canceller is a far end cross talk canceller.

\* \* \* \* \*